(12) United States Patent
Mori (10) Patent No.: US 12,342,455 B2
(45) Date of Patent: Jun. 24, 2025

(54) LAYER-TO-LAYER REGISTRATION MEASUREMENT MARK

(71) Applicant: INTERNATIONAL BUSINESS MACHINES CORPORATION, Armonk, NY (US)

(72) Inventor: Hiroyuki Mori, Yasu (JP)

(73) Assignee: International Business Machines Corporation, Armonk, NY (US)

( * ) Notice: Subject to any disclaimer, the term of this patent is extended or adjusted under 35 U.S.C. 154(b) by 616 days.

(21) Appl. No.: 17/651,436

(22) Filed: Feb. 17, 2022

(65) Prior Publication Data

US 2023/0262882 A1    Aug. 17, 2023

(51) Int. Cl.
| H05K 1/00 | (2006.01) |
| G01B 21/24 | (2006.01) |
| H05K 1/02 | (2006.01) |

(52) U.S. Cl.
CPC ........... *H05K 1/0269* (2013.01); *G01B 21/24* (2013.01); *H05K 2201/09936* (2013.01)

(58) Field of Classification Search
CPC ....... H05K 1/0269; H05K 2201/09936; G01B 21/24
See application file for complete search history.

(56) References Cited

U.S. PATENT DOCUMENTS

| 6,507,495 B1 | 1/2003 | Hailey |
| 9,958,496 B2 | 5/2018 | Moran |
| 2002/0111038 A1* | 8/2002 | Matsumoto ......... G03F 7/70633 438/763 |
| 2005/0097764 A1* | 5/2005 | Kim .................... G03F 7/70633 33/562 |
| 2024/0029230 A1* | 1/2024 | Lee .......................... G06T 7/62 |

FOREIGN PATENT DOCUMENTS

| CN | 100596253 C | 3/2010 |
| CN | 102032885 B | 5/2013 |
| JP | 2001083688 A | 3/2001 |
| JP | 2001168537 A | 6/2001 |
| JP | 2010062474 A | 3/2010 |
| JP | 2013503493 A | 1/2013 |
| JP | 2013115384 A | 6/2013 |
| JP | 2015015424 A | 1/2015 |

OTHER PUBLICATIONS

Disclosed Anonymously, "Method and System for Measuring Layer to Layer Registration in Printed Circuit Boards", https://priorart.ip.com/IPCOM/000200886, Oct. 28, 2010, pp. 1-4.

\* cited by examiner

*Primary Examiner* — Pete T Lee
(74) *Attorney, Agent, or Firm* — Yuanmin Cai (57) ABSTRACT

Embodiments of present invention provide a multilayer printed circuit board. The printed circuit board includes a first conducting layer (CL) having a first measurement mark area (MMA) and a second CL having a second MMA. A first polygonal measurement mark (MM) in the first MMA and a second and a third polygonal MM in the second MMA, wherein the second polygonal MM is positioned along an extended first angle bisector bisecting a first vertex of the first polygonal MM and a first vertex of the second polygonal MM is substantially aligned with the first vertex of the first polygonal MM, and wherein the third polygonal MM is positioned along an extended second angle bisector bisecting a second vertex of the first polygonal MM and a first vertex of the third polygonal MM is substantially aligned with the second vertex of the first polygonal MM.

20 Claims, 7 Drawing Sheets

LAYER-TO-LAYER REGISTRATION MEASUREMENT MARK

FIELD OF THE INVENTION

The present application relates to manufacturing of multilayer printed circuit board. More particularly, it relates to layer-to-layer registration measurement mark of the printed circuit board.

BACKGROUND

High bandwidth requirement due to data transmission in high-end computer systems, especially those used in artificial intelligence (AI) applications, is demanding higher density of interconnect for semiconductor devices. For example, the circuitries of processor and memory devices are getting not only much denser but closer to each other. Meanwhile, in response to increasing circuitry density, rapid progress has been made so far in making narrower line width and spacing in packaging substrate such as printed circuit board. All the above has resulted in layer-to-layer registration that sometimes becomes larger than the line width and/or spacing.

The layer-to-layer registration has more impact on the electrical characteristics of data transmission. For more accurate electrical characterization using actual test coupons, amount of layer-to-layer registration per coupon is required. Currently, a typical way of assessing the amount of layer-to-layer registration is to conduct destructive analysis by cross cutting some test coupons to perform the actual measurement. Nevertheless, this approach is not only time consuming, costly, but sometimes the limited availability of test coupons may hinder the scope of such analysis.

SUMMARY

Embodiments of present invention provide a multilayer printed circuit board. The printed circuit board includes a first conducting layer (CL) and a second CL, the first CL being separated from the second CL by a first non-conducting layer (NCL); a first measurement mark area (MMA) in the first CL and a second MMA in the second CL, the first MMA overlapping with the second MMA; a first polygonal measurement mark (MM) in the first MMA; and a second polygonal MM and a third polygonal MM in the second MMA, wherein the second polygonal MM is positioned along an extended first angle bisector bisecting a first vertex of the first polygonal MM and a first vertex of the second polygonal MM close to the first polygonal MM is substantially aligned with the first vertex of the first polygonal MM, and wherein the third polygonal MM is positioned along an extended second angle bisector bisecting a second vertex of the first polygonal MM and a first vertex of the third polygonal MM close to the first polygonal MM is substantially aligned with the second vertex of the first polygonal MM.

Embodiments of present invention provide a multilayer printed circuit board. The multilayer printed circuit board includes a first conducting layer (CL) and a second CL, the first CL being separated from the second CL by a first non-conducting layer (NCL); at least three first measurement mark areas (MMAs) in the first CL and at least three second MMAs in the second CL, the at least three first MMAs individually overlapping with the at least three second MMAs; and a first polygonal measurement mark (MM) in each of the at least three first MMAs; and a second polygonal MM and a third polygonal MM in each of the at least three second MMAs, wherein the second polygonal MM is positioned along an extended first angle bisector bisecting a first vertex of the first polygonal MM and a first vertex of the second polygonal MM close to the first polygonal MM is substantially aligned with the first vertex of the first polygonal MM, and wherein the third polygonal MM is positioned along an extended second angle bisector bisecting a second vertex of the first polygonal MM and a first vertex of the third polygonal MM close to the first polygonal MM is substantially aligned with the second vertex of the first polygonal MM.

Embodiments of present invention further provide a method of measuring layer-to-layer registration. The method includes providing a multilayer printed circuit board having a first polygonal measurement mark (MM) in a first measurement mark area (MMA) of a first conducting layer (CL) and a second polygonal MM in a second MMA of a second CL, the first polygonal MM having a vertex with a first side A1 and a second side B1 and the second polygonal MM having a vertex with a first side A2 and s second side B2, the first side A1 being parallel to the first side A2 and the second side B1 being parallel to the second side B2, measuring a first distance dX between the first side A1 and the first side A2; measuring a second distance dY between the second side B1 and the second side B2; and calculating a mark misalignment dR from the first distance dX and the second distance dY.

BRIEF DESCRIPTION OF THE DRAWINGS

The present invention will be understood and appreciated more fully from the following detailed description of embodiments of present invention, taken in conjunction with accompanying drawings of which.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION OF PREFERRED EMBODIMENTS

In the below detailed description and the accompanying drawings, it is to be understood that various layers, structures, and regions shown in the drawings are both demonstrative and schematic illustrations that are not drawn to scale. In addition, for the ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures may not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Figure 1A:
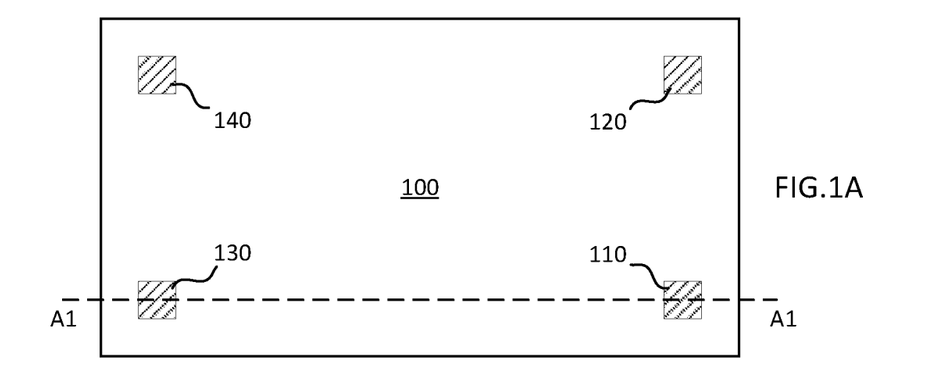
FIGS. 1A, 1B, and 1C are demonstrative illustrations of a first, a second, and a third conducting layer of a multilayer printed circuit board
Figure 1B:
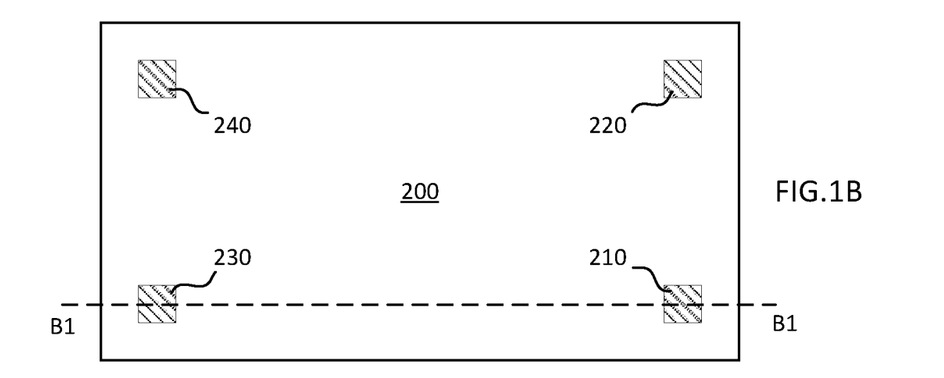
Figure 1C:
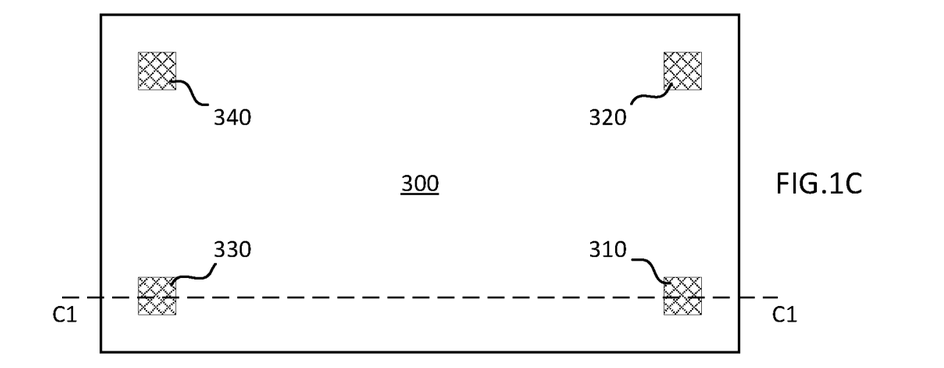
Figure 1D:
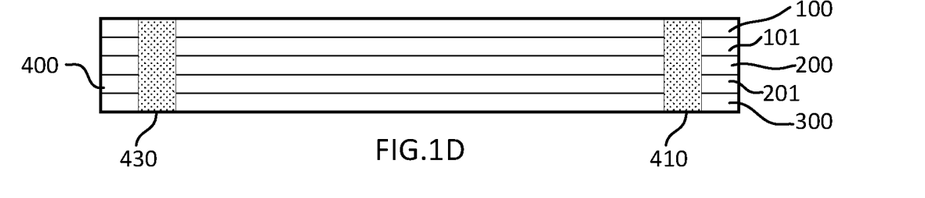
FIG. 1D is a demonstrative illustration of a cross-sectional view of the multilayer printed circuit board according to one embodiment of present invention.

FIGS. 1A, 1B, and 1C are demonstrative illustrations of a first, a second, and a third conducting layer of a multilayer printed circuit board and FIG. 1D is a demonstrative illustration of a cross-sectional view of the multilayer printed circuit board according to one embodiment of present invention. More specifically, FIG. 1D illustrates a multilayer printed circuit board 400 that includes a first conducting layer 100, a second conducting layer 200, a third conducting layer 300, a first non-conducting layer 101, and a second non-conducting layer 201. The first conducting layer (CL) 100 is over the second CL 200 and separated from the second CL 200 by the first non-conducting layer (NCL) 101. The third CL 300 is underneath the second CL 200 and separated from the second CL 200 by a second NCL 201. However, embodiments of present invention are not limited in this aspect. The first CL 100 may be underneath the second CL 200 and/or the third CL 300 may be over the first CL 100. In other words, the positional relationship among the first, second, and third CLs in FIG. 1D is for illustration purpose only.

Moreover, FIG. 1A illustrates the first CL 100. The first CL 100 may include one or more first measurement mark areas (MMAs) such as a first MMA 110, a first MMA 120, a first MMA 130, and a first MMA 140. FIG. 1B illustrates the second CL 200 that may include one or more second MMAs such as a second MMA 210, a second MMA 220, a second MMA 230, and a second MMA 240. FIG. 1C illustrates the third CL 300 that may include one or more third MMAs such as a third MMA 310, a third MMA 320, a third MMA 330, and a third MMA 340. First MMAs 110, 120, 130, and 140 of the first CL 100 may overlap or substantially overlap, respectively, with second MMAs 210, 220, 230, and 240 of the second CL 200. In turn, second MMAs 210, 220, 230, and 240 of the second CL 200 may overlap or substantially overlap, respectively, with third MMAs 310, 320, 330, and 340 of the third CL 300. For example, first MMA 110, second MMA 210, and third MMA 310 may overlap with each other in a measurement mark area 410 as is illustrated in FIG. 1D. Similarly, first MMA 130, second MMA 230, and third MMA 330 may overlap with each other in a measurement mark area 430 as is illustrated in FIG. 1D as well. FIG. 1D is a cross-sectional view of the multilayer printed circuit board taking along the A1-A1, B1-B1, and C1-C1 lines as indicated in FIGS. 1A, 1B, and 1C.

Conductive material such as, for example, copper (Cu) or other opaque materials in the measurement mark areas of the first CL 100, the second CL 200, and the third CL 300 may be removed or otherwise etched away such that measurement marks, as will be described below in more details, that are placed inside the measurement mark areas for layer-to-layer registration purpose may be visible, compared, and quantitatively measured from above the multilayer printed circuit board.

Figure 2A:
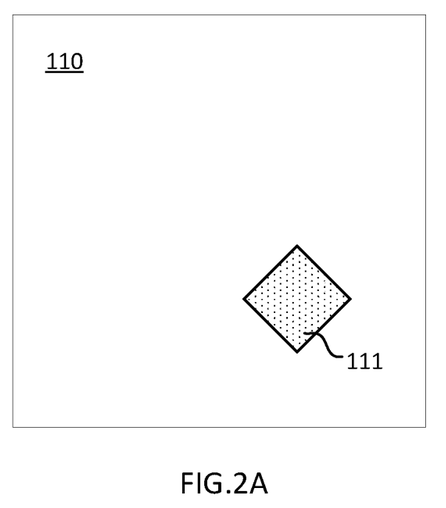
FIGS. 2A, 2B, and 2C are demonstrative illustrations of a first, a second, and a third measurement mark area of the first, the second, and the third conducting layer
Figure 2B:
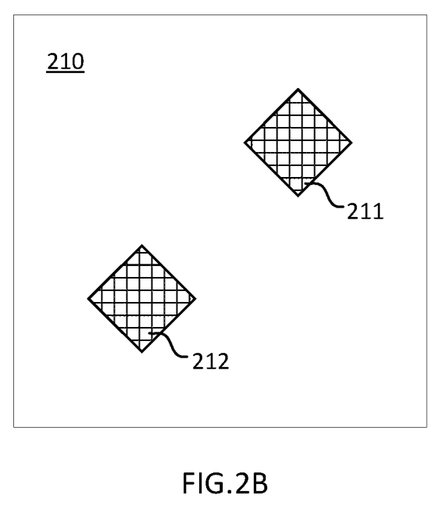
Figure 2C:
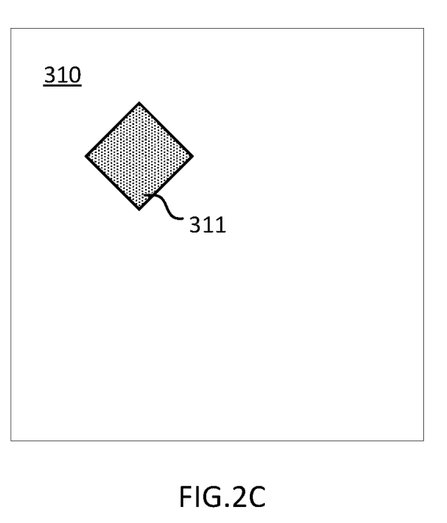
Figure 2D:
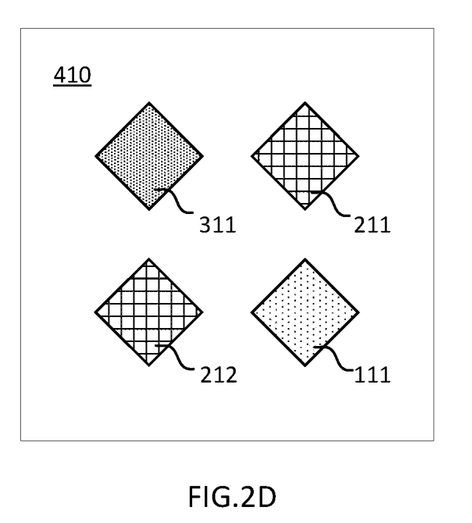
FIG. 2D is a demonstrative illustration of overlapped first, second, and third measurement mark areas according to one embodiment of present invention.

FIGS. 2A, 2B, and 2C are demonstrative illustrations of a first, a second, and a third measurement mark area of the first, the second, and the third conducting layer and FIG. 2D is a demonstrative illustration of overlapped first, second, and third measurement mark areas according to one embodiment of present invention. More specifically, FIG. 2A illustrates first MMA 110 having a first measurement mark (MM) 111 in a lower right corner thereof; FIG. 2B illustrates second MMA 210 having a second MM 211 in an upper right corner thereof and a third MM 212 in a lower left corner thereof; and FIG. 2C illustrates third MMA 310 having a fourth MM 311 in an upper left corner thereof. Moreover, FIG. 2D illustrates a composite of first MM 111, second MM 211, third MM 212, and fourth MM 311 when first MMA 110, second MMA 210, and third MMA 310 overlap with each other. In other words, when first CL 100, second CL 200, and third CL 300 are vertically stacked together to make a multilayer printed circuit board, by design first MMA 110, second MMA 210, and third MMA 310 are substantially aligned to create a layer-to-layer registration in measurement mark area 410 as being illustrated in FIG. 2D.

It is to be noted here that for ease of explanation without loss of generality, description of embodiments of present invention herein focuses on measurement mark area 410 where first MMA 110 of first CL 100, second MMA 210 of second CL 200, and third MMA 310 of third CL 300 overlap with each other. However, a person skilled in the art will appreciate that the same or substantially same description may be applied to other measurement mark areas such as, for example, where MMAs 120, 220, and 320 overlap, where MMAs 130, 230, and 330 overlap (which is measurement mark area 430 as is illustrated in FIG. 1D), or where MMAs 140, 240, and 340 overlap.

It is further to be noted that for ease of explanation without loss of generality, description of embodiments of present invention assumes that first MMA 110 includes first MM 111, second MMA 210 includes second MM 211 and third MM 212, and third MMA 310 includes fourth MM 311. However, embodiments of present invention are not limited in this aspect. For example, in one embodiment, first MMA 110 may include second MM 211 and third MM 212, second MMA 210 may include first MM 111, and third MMA 310 may include fourth MM 311. In yet another embodiment, first MMA 110 may include fourth MM 311, second MMA 210 may include second MM 211 and third MM 212, and third MMA 310 may include first MM 111. In other words, first MMA 110, second MMA 210, and third MMA 310 may include any one of first MM 111, second MM 211 and third MM 212, and fourth MM 311, respectively.

Figure 3A:
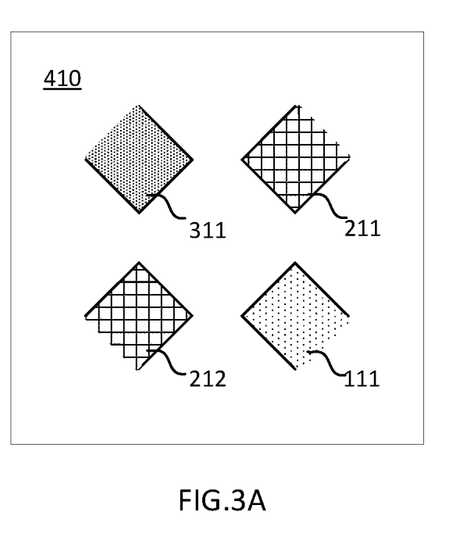
FIG. 3A is a demonstrative illustration of measurement marks according to one embodiment.
Figure 3B:
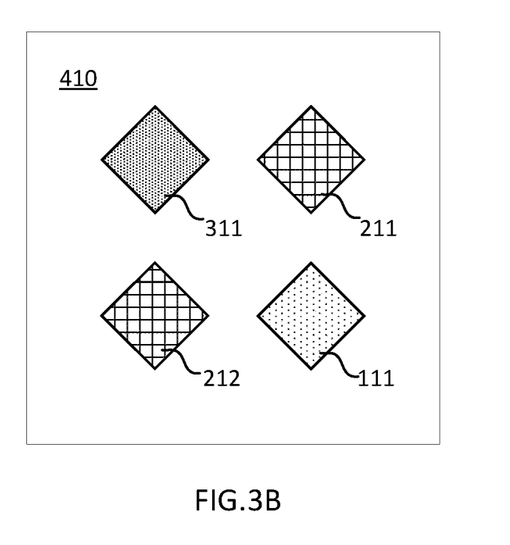
FIGS. 3B, 3C, and 3D are demonstrative illustrations of specific sample measurement marks according to several embodiments of present invention.
Figure 3C:
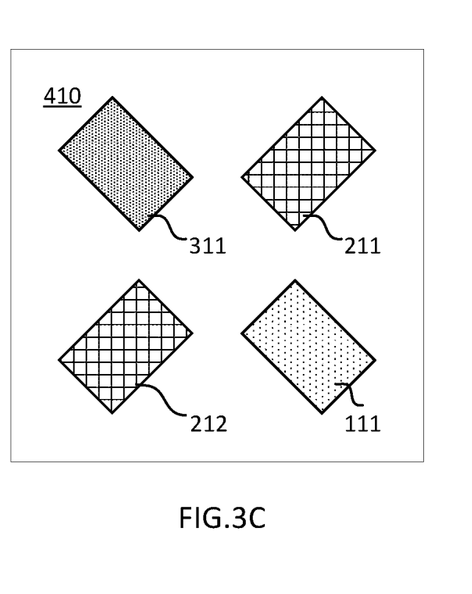
Figure 3D:
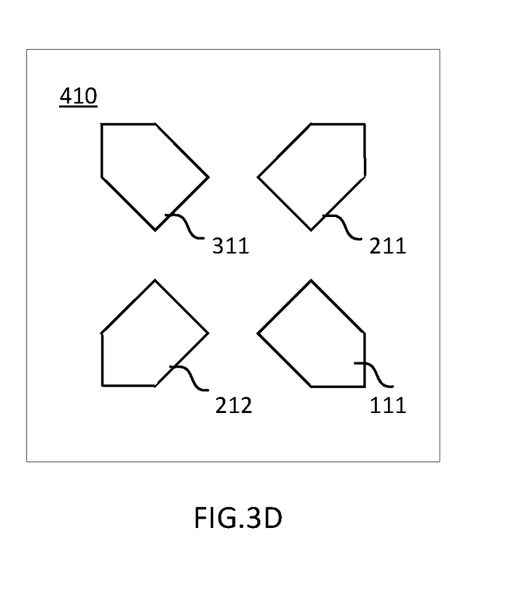

FIG. 3A is a demonstrative illustration of measurement marks according to one embodiment, and FIGS. 3B, 3C, and 3D are demonstrative illustrations of specific sample measurement marks according to several embodiments of present invention. More specifically, first MM 111, second MM 211, third MM 212, and fourth MM 311 all have at least three neighboring sides that form two right angles. In other words, first MM 111, second MM 211, third MM 212, and fourth MM 311 all have at least three neighboring sides that resemble three sides of a rectangle. These sides of the first, second, third, and fourth MMs that resemble the shape of a rectangle face each other, as being demonstratively illustrated in FIG. 3A.

In one embodiment, first MM 111, second MM 211, third MM 212, and fourth MM 311 are polygons or in polygonal shapes. For example, first MM 111, second MM 211, third MM 212, and fourth MM 311 may be squares as being illustrated in FIG. 3B, may be rectangles as being illustrated in FIG. 3C wherein the rectangles have a length that is different from a width, or may be pentagons as being illustrated in FIG. 3D wherein three neighboring sides resembles three sides of a rectangle. However, embodiments of present invention are not limited in this aspect. For example, except portions that face each other and resemble the shape of a rectangular, the rest portions of first MM 111, second MM 211, third MM 212, and fourth MM 311 may have any other shapes such as, for example, curved shapes.

Hereinafter, for reference only without loss of generally, first MM 111, second MM 211, third MM 212, and fourth MM 311 are illustrated to have square shapes, and in some embodiment square shapes with rounded corners, as being illustrated in FIGS. 5, 5A, 6, 6A, and 7, 7A. First MM 111, second MM 211, third MM 212, and fourth MM 311 may be referred to as first polygonal MM 111, second polygonal MM 211, third polygonal MM 212, and fourth polygonal MM 311.

Figure 4:
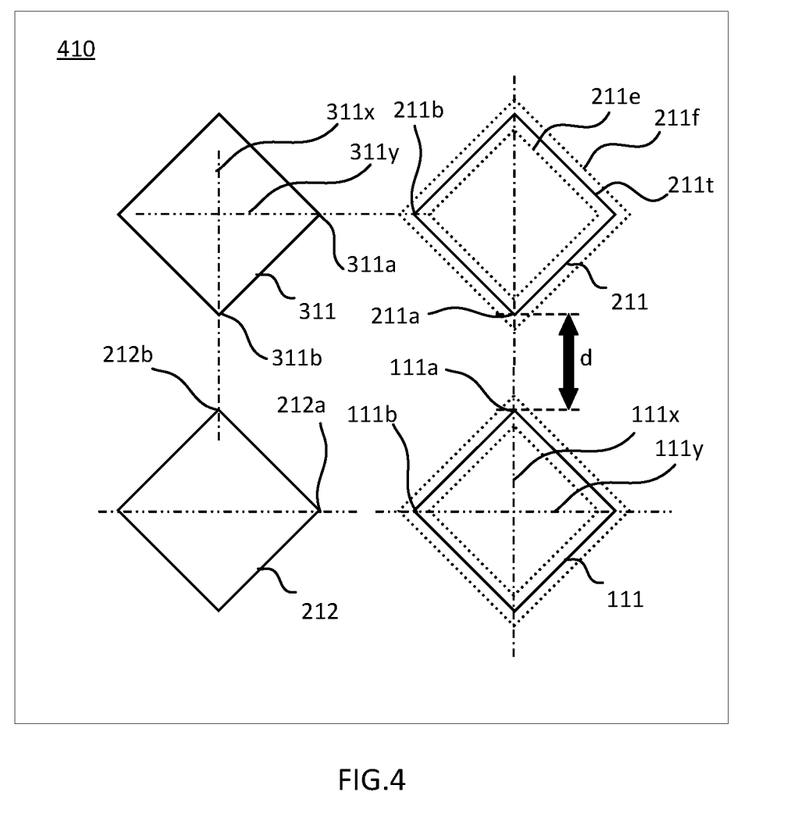
FIG. 4 is a demonstrative illustration of measurement marks that are spaced by a certain distance according to one embodiment of present invention.

FIG. 4 is a demonstrative illustration of measurement marks that are spaced by a certain distance according to one embodiment of present invention. More specifically, the second polygonal MM 211 is positioned along an extended first angle bisector 111$x$ bisecting a first vertex 111$a$ of the first polygonal MM 111. A first vertex 211$a$ of the second polygonal MM 211 close to the first polygonal MM 111 is substantially aligned with the first vertex 111$a$ of the first polygonal MM 111. The third polygonal MM 212 is positioned along an extended second angle bisector 111$y$ bisecting a second vertex 111$b$ of the first polygonal MM 111. A first vertex 212$a$ of the third polygonal MM 212 close to the first polygonal MM 111 is substantially aligned with the second vertex 111$b$ of the first polygonal MM 111.

In one embodiment, the second polygonal MM 211 is positioned along an extended first angle bisector 311$y$ bisecting a first vertex 311$a$ of the fourth polygonal MM 311. A second vertex 211$b$ of the second polygonal MM 211 close to the fourth polygonal MM 311 is substantially aligned with the first vertex 311$a$ of the fourth polygonal MM 311. The third polygonal MM 212 is positioned along an extended second angle bisector 311$x$ bisecting a second vertex 311$b$ of the fourth polygonal MM 311. A second vertex 212$b$ of the third polygonal MM 212 close to the fourth polygonal MM 311 is substantially aligned with the second vertex 311$b$ of the fourth polygonal MM 311.

In one embodiment, the first polygonal MM 111, the second polygonal MM 211, the third polygonal MM 212, and the fourth polygonal MM 311 are squares. The extended first angle bisector 111$x$ of the first polygonal MM 111 is an extended first diagonal of the first polygonal MM 111. The extended second angle bisector 111$y$ of the first polygonal MM 111 is an extended second diagonal of the first polygonal MM 111. The extended second diagonal of the first polygonal MM 111 is perpendicular to the extended first diagonal of the first polygonal MM 111. Similarly, the extended first angle bisector 311$y$ of the fourth polygonal MM 311 is an extended first diagonal of the fourth polygonal MM 311, and the extended second angle bisector 311$x$ of the fourth polygonal MM 311 is an extended second diagonal of the fourth polygonal MM 311 and is perpendicular to the extended first diagonal of the fourth polygonal MM 311.

In another embodiment, squares of the first polygonal MM 111, the second polygonal MM 211, the third polygonal MM 212, and the fourth polygonal MM 311 have a side of a length of around 9 to 11 micrometers, and the first vertex 111$a$ of the first polygonal MM 111 and the first vertex 211$a$ of the second polygonal MM 211 are separated by a distance d, as illustrated in FIG. 4, of around 6 to 7 micrometers.

As being illustrated in FIG. 4, for example, with regard to the second polygonal MM 211, dashed squares 211$e$ and 211$f$ next to a solid square 211$t$, which represents a target design of the second polygonal MM 211, denote tolerance range of size variation of the second polygonal MM 211. The size variation could be caused by, for example, under-etching or over-etching conditions during a manufacturing process of the second polygonal MM 211. According to one embodiment, the first polygonal MM 111 and the second polygonal MM 211 may be placed at a distance d that equals to or is larger than [2*sqrt(2)*(etching tolerance)+(layer-to-layer max tolerance)]. Such a distance ensures that the first polygonal MM 111 and the second polygonal MM 211 may not be closer than the layer-to-layer max tolerance.

Measurement marks and in particular polygonal measurement marks, for example square or rectangle measurement marks, may have rounded corners due to, for example, limitation in design and/or variation in manufacturing process such as excessive etching. Embodiments of present invention provide a method of measuring the amount of misalignment between two measurement marks, under this circumstance, as being described below in more details with reference to FIGS. 5, 5A, 6, 6A, and 7, 7A.

Figure 5:
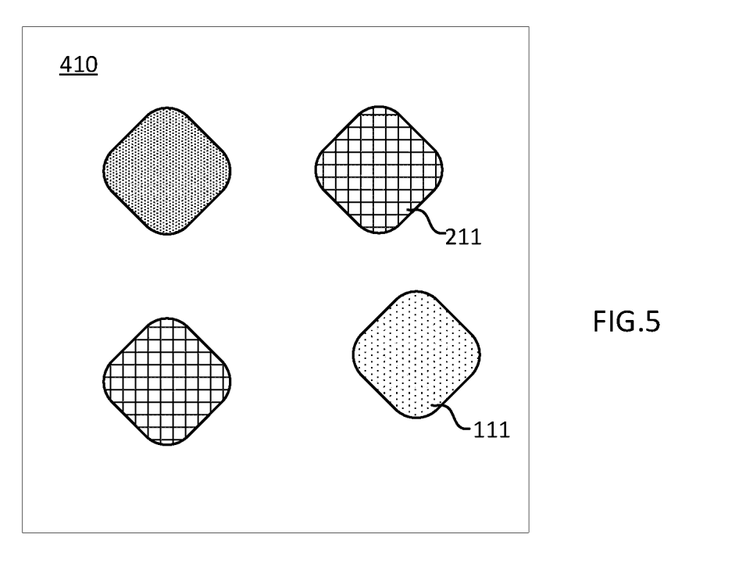
FIG. 5 is a demonstrative illustration of layer-to-layer registration and FIG. 5A is a demonstrative illustration of a method of measuring the layer-to-layer registration according to one embodiment of present invention.
Figure 5A:
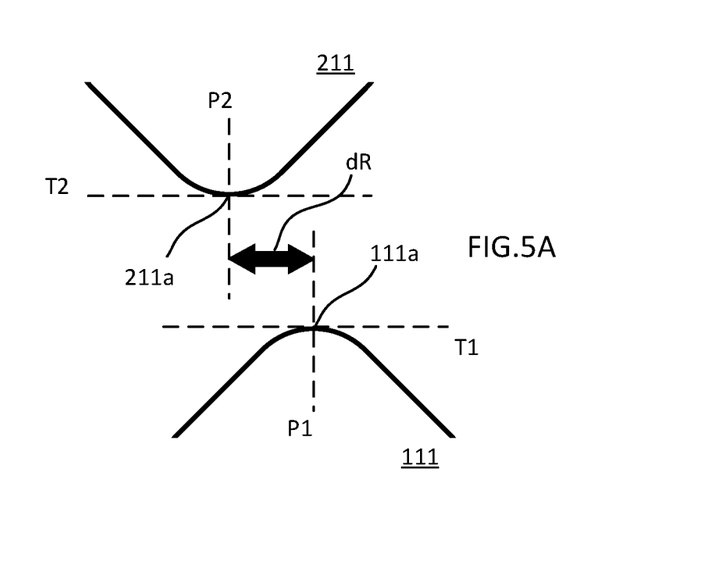

FIG. 5 is a demonstrative illustration of layer-to-layer registration and FIG. 5A is a demonstrative illustration of a method of measuring the layer-to-layer registration according to one embodiment of present invention. Here, for the ease of explanation without loss of generality, the first polygonal MM 111 is assumed to be misaligned with the second polygonal MM 211, resulting a mark misalignment dR. FIG. 5A illustrates one embodiment of a method of measuring mark misalignment dR. In particular, a first horizontal line T1 is tangentially drawn next to the first polygonal MM 111 to identify an apex of vertex 111*a*. A second horizontal line T2 is tangentially drawn next to the second polygonal MM 211 to identify an apex of vertex 211*a*. FIG. 5A further illustrates placing a first angle bisector P1 bisecting vertex 111*a* of the first polygonal MM 111, placing a second angle bisector P2 bisecting vertex 211*a* of the second polygonal MM 211, and calculating a mark misalignment dR as a horizontal distance between vertex 111*a* and vertex 211*a*, which is a distance between the first angle bisector P1 and the second angle bisector P2. In one embodiment, the mark misalignment dR is less than 10 micrometers. For example, the mark misalignment dR may be less than 5 micrometers.

Figure 6:
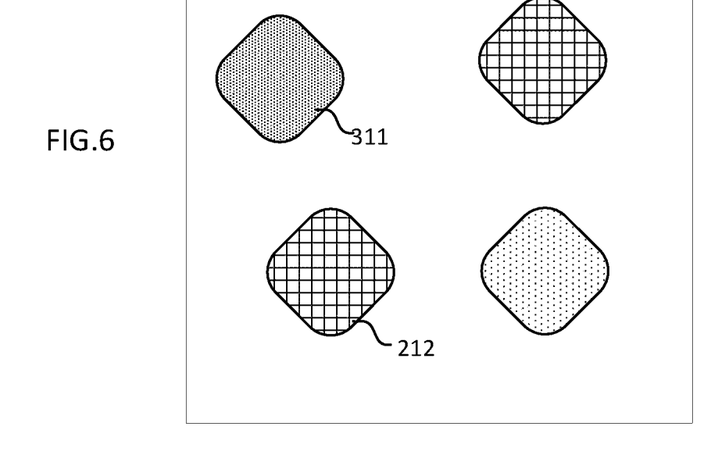
FIG. 6 is a demonstrative illustration of layer-to-layer registration and FIG. 6A is a demonstrative illustration of a method of measuring the layer-to-layer registration according to another embodiment of present invention.
Figure 6A:
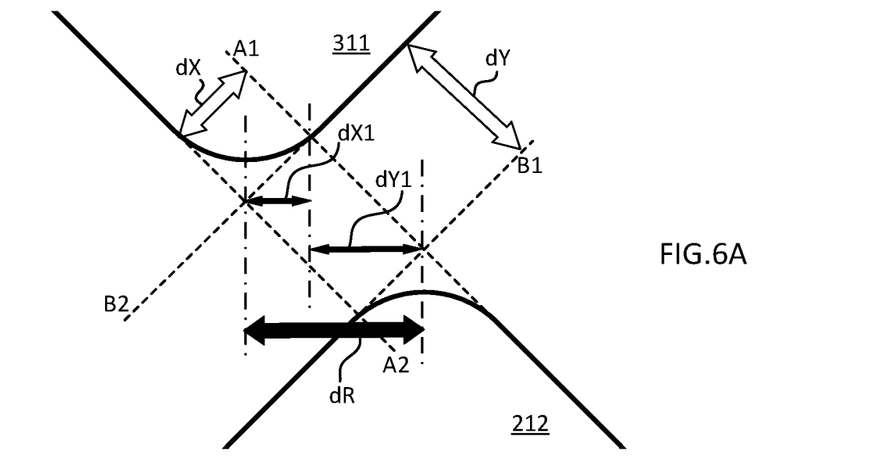

FIG. 6 is a demonstrative illustration of layer-to-layer registration and FIG. 6A is a demonstrative illustration of a method of measuring the layer-to-layer registration according to another embodiment of present invention. Here, for the ease of explanation without loss of generality, it is assumed that the third polygonal MM 212 is misaligned with the fourth polygonal MM 311 as is illustrated in FIG. 6A. The third polygonal MM 212 has a vertex with a first side A1 and a second side B1 and the fourth polygonal MM 311 has a vertex with a first side A2 (parallel to A1) and a second side B2 (parallel to B1). Either the first side A1 (and A2) or the second side B1 (and B2) extends into the fourth polygonal MM 311 (and third polygonal MM 212). Embodiment of present invention measures a first distance dX from the first side A1 to the first side A2, a second distance dY from the second side B1 to the second side B2, and then calculates a mark misalignment dR as dR=dX1+dY1=dX/sqrt(2)+dY/sqrt(2).

Figure 7:
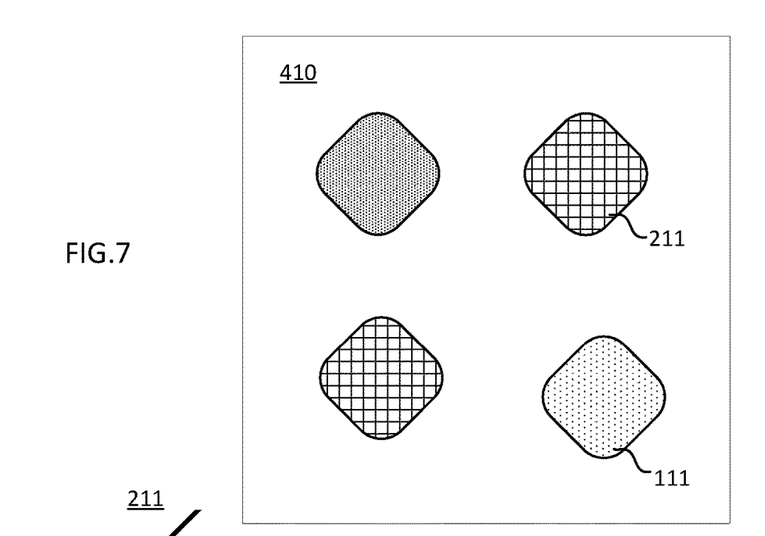
FIG. 7 is a demonstrative illustration of layer-to-layer registration and FIG. 7A is a demonstrative illustration of a method of measuring the layer-to-layer registration according to yet another embodiment of present invention.
Figure 7A:
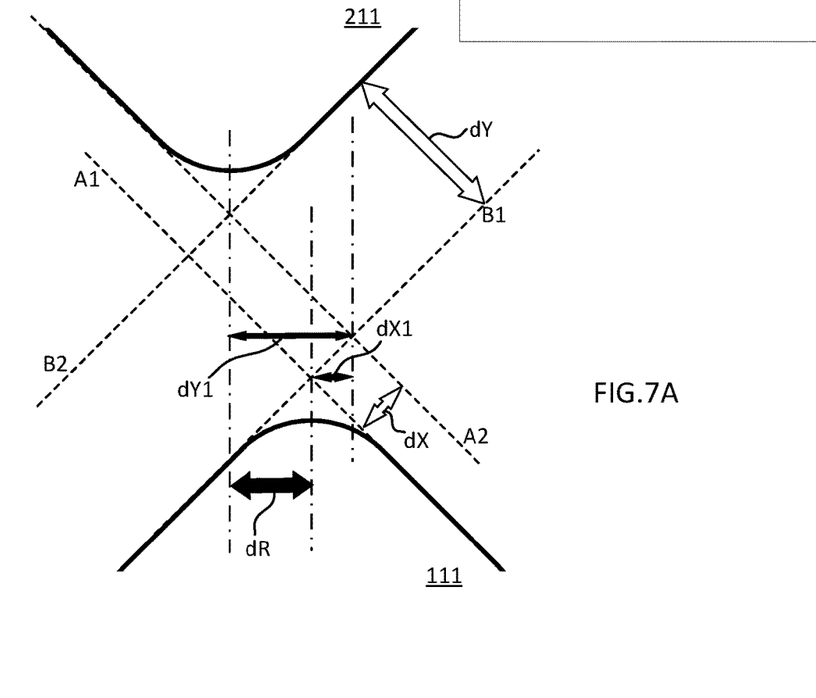

FIG. 7 is a demonstrative illustration of layer-to-layer registration and FIG. 7A is a demonstrative illustration of a method of measuring the layer-to-layer registration according to yet another embodiment of present invention. Here, for the ease of explanation without loss of generality, it is assumed that the first polygonal MM 111 is misaligned with the second polygonal MM 211 as is illustrated in FIG. 7A. The first polygonal MM 111 has a vertex with a first side A1 and a second side B1 and the second polygonal MM 211 has a vertex with a first side A2 (parallel to A1) and a second side B2 (parallel to B1). Neither the first side A1 (and A2) nor the second side B1 (and B2) extends into the second polygonal MM 211 (and first polygonal MM 111). Embodiment of present invention measures a first distance dX from the first side A1 to the first side A2, and a second distance from the second side B1 to the second side B2, and then calculates a mark misalignment dR as dR=|dX1−dY1|=|dX/sqrt(2)−dY/sqrt(2)|.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given illustration or drawing. This does not imply that any layers, structures, and regions not explicitly shown are omitted from the actual semiconductor structures.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While certain features of the invention have been illustrated and described herein, many modifications, substitutions, changes, and equivalents will now occur to those of ordinary skill in the art. Such changes, modification, and/or alternative embodiments may be made without departing from the spirit of present invention and are hereby all considered within the scope of present invention. It is, therefore, to be understood that the appended claims are intended to cover all such modifications and changes as fall within the spirit of the invention.

What is claimed is:

1. A multilayer printed circuit board comprising:
   a first conducting layer (CL) and a second CL, the first CL being separated from the second CL by a first non-conducting layer (NCL);
   a first measurement mark area (MMA) in the first CL and a second MMA in the second CL, the first MMA overlapping with the second MMA;
   a first polygonal measurement mark (MM) in the first MMA; and
   a second polygonal MM and a third polygonal MM in the second MMA,
   wherein the second polygonal MM is positioned along an extended first angle bisector bisecting a first vertex of the first polygonal MM and a first vertex of the second polygonal MM close to the first polygonal MM is substantially aligned with the first vertex of the first polygonal MM, and
   wherein the third polygonal MM is positioned along an extended second angle bisector bisecting a second vertex of the first polygonal MM and a first vertex of the third polygonal MM close to the first polygonal MM is substantially aligned with the second vertex of the first polygonal MM.

2. The multilayer printed circuit board of claim 1, wherein the first polygonal MM, the second polygonal MM, and the third polygonal MM are squares, the extended first angle bisector of the first polygonal MM is an extended first diagonal thereof, and the extended second angle bisector of the first polygonal MM is an extended second diagonal thereof, and the extended second diagonal is perpendicular to the extended first diagonal.

3. The multilayer printed circuit board of claim 2, wherein the first polygonal MM, the second polygonal MM, and the third polygonal MM are squares with a side of a length of about 9 to 11 micrometers, and the first vertex of the first polygonal MM and the first vertex of the second polygonal MM is separated by about 6 to 7 micrometers.

4. The multilayer printed circuit board of claim 2, wherein the first polygonal MM, the second polygonal MM, and the third polygonal MM have rounded corners.

5. The multilayer printed circuit board of claim 1, wherein an extended first angle bisector bisecting the first vertex of the second polygonal MM parallels or overlaps with the extended first angle bisector of the first polygonal MM, and an extended first angle bisector bisecting the first vertex of the third polygonal MM parallels or overlaps with the extended second angle bisector of the first polygonal MM.

6. The multilayer printed circuit board of claim 5, wherein a distance between the extended first angle bisector of the second polygonal MM and the extended first angle bisector of the first polygonal MM is less than 5 micrometers, and a distance between the extended first angle bisector of the third polygonal MM and the extended second angle bisector of the first polygonal MM is less than 5 micrometers.

7. The multilayer printed circuit board of claim 1, wherein the first polygonal MM, the second polygonal MM, and the third polygonal MM are rectangles having a length that is different from a width.

8. The multilayer printed circuit board of claim 1, wherein the first polygonal MM, the second polygonal MM, and the third polygonal MM are pentagons with each pentagon having three neighboring sides resembling three sides of a rectangle.

9. The multilayer printed circuit board of claim 1, further comprising:
a third CL, the first CL and the second CL being separated from the third CL by at least a second NCL;
a third MMA in the third CL, the first MMA and the second MMA overlapping with the third MMA; and
a fourth polygonal MM in the third MMA,
wherein the second polygonal MM is positioned along an extended first angle bisector bisecting a first vertex of the fourth polygonal MM and a second vertex of the second polygonal MM close to the fourth polygonal MM is substantially aligned with the first vertex of the fourth polygonal MM, and
wherein the third polygonal MM is positioned along an extended second angle bisector bisecting a second vertex of the fourth polygonal MM and a second vertex of the third polygonal MM close to the fourth polygonal MM is substantially aligned with the second vertex of the fourth polygonal MM.

10. The multilayer printed circuit board of claim 9, wherein the first polygonal MM, the second polygonal MM, the third polygonal MM, and the fourth polygonal MM are squares, the extended first and second angle bisectors of the first polygonal MM are extended first and second diagonals of the first polygonal MM that are perpendicular to each other, and the extended first and second angle bisectors of the fourth polygonal MM are extended first and second diagonals of the fourth polygonal MM that are perpendicular to each other.

11. The multilayer printed circuit board of claim 9, wherein the first polygonal MM, the second polygonal MM, the third polygonal MM, and the fourth polygonal MM are rectangles having a length that is different from a width.

12. A multilayer printed circuit board comprising:
a first conducting layer (CL) and a second CL, the first CL being separated from the second CL by a first non-conducting layer (NCL);
at least three first measurement mark areas (MMAs) in the first CL and at least three second MMAs in the second CL, the at least three first MMAs individually overlapping with the at least three second MMAs; and
a first polygonal measurement mark (MM) in each of the at least three first MMAs; and
a second polygonal MM and a third polygonal MM in each of the at least three second MMAs,
wherein the second polygonal MM is positioned along an extended first angle bisector bisecting a first vertex of the first polygonal MM and a first vertex of the second polygonal MM close to the first polygonal MM is substantially aligned with the first vertex of the first polygonal MM, and
wherein the third polygonal MM is positioned along an extended second angle bisector bisecting a second vertex of the first polygonal MM and a first vertex of the third polygonal MM close to the first polygonal MM is substantially aligned with the second vertex of the first polygonal MM.

13. The multilayer printed circuit board of claim 12, wherein the first polygonal MM, the second polygonal MM, and the third polygonal MM are squares, the extended first angle bisector of the first polygonal MM is an extended first diagonal thereof, the extended second angle bisector of the first polygonal MM is an extended second diagonal thereof, and the extended second diagonal is perpendicular to the extended first diagonal.

14. The multilayer printed circuit board of claim 12, wherein the first polygonal MM, the second polygonal MM, and the third polygonal MM have rounded corners.

15. The multilayer printed circuit board of claim 12, further comprising:
a third CL, the first CL and the second CL being separated from the third CL by at least a second NCL;
at least three third MMAs in the third CL, the at least three first MMAs and the at least three second MMAs individually overlapping with the at least three third MMAs; and
a fourth polygonal MM in each of the at least three third MMAs,
wherein the second polygonal MM is positioned along an extended first angle bisector bisecting a first vertex of the fourth polygonal MM and a second vertex of the second polygonal MM close to the fourth polygonal MM is substantially aligned with the first vertex of the fourth polygonal MM, and
wherein the third polygonal MM is positioned along an extended second angle bisector bisecting a second vertex of the fourth polygonal MM and a second vertex of the third polygonal MM close to the fourth polygonal MM is substantially aligned with the second vertex of the fourth polygonal MM.

16. The multilayer printed circuit board of claim 15, wherein an extended first angle bisector bisecting the first vertex of the second polygonal MM parallels or overlaps with the extended first angle bisector of the first polygonal MM, and an extended first angle bisector bisecting the first vertex of the third polygonal MM parallels or overlaps with the extended second angle bisector of the first polygonal MM.

17. The multilayer printed circuit board of claim 16, wherein a distance between the extended first angle bisector of the second polygonal MM and the extended first angle bisector of the first polygonal MM is less than 5 micrometers, and a distance between the extended first angle bisector of the third polygonal MM and the extended second angle bisector of the first polygonal MM is less than 5 micrometers.

18. A method of measuring layer-to-layer registration comprising:
providing a multilayer printed circuit board having a first polygonal measurement mark (MM) in a first measurement mark area (MMA) of a first conducting layer (CL) and a second polygonal MM in a second MMA of a second CL, the first polygonal MM having a vertex with a first side A1 and a second side B1 and the second polygonal MM having a vertex with a first side A2 and a second side B2, the first side A1 being parallel to the first side A2 and the second side B1 being parallel to the second side B2,
measuring a first distance dX between the first side A1 and the first side A2;
measuring a second distance dY between the second side B1 and the second side B2; and
calculating a mark misalignment dR from the first distance dX and the second distance dY.

19. The method of claim 18, wherein when either the first side A1 or the second side B1 extends into the second polygonal MM, calculating the mark misalignment dR as:

$$dR = dX/\mathrm{sqrt}(2) + dY/\mathrm{sqrt}(2).$$

20. The method of claim 18, wherein when neither the first side A1 nor the second side B1 extends into the second polygonal MM, calculating the mark misalignment dR as:

$$dR = |dX/\mathrm{sqrt}(2) - dY/\mathrm{sqrt}(2)|.$$

* * * * *